United States Patent
Yendluri et al.

(10) Patent No.: US 9,000,839 B2
(45) Date of Patent: Apr. 7, 2015

(54) LOW DISTORTION FILTERS

(75) Inventors: Shanthi Pavan Yendluri, Madras (IN); Siva Viswanathan Thyagarajan, Madras (IN)

(73) Assignees: The Secretary, Department of Information and Technology, New Delhi (IN); Indian Institute of Technology, Madras, Chennai (IN)

( * ) Notice: Subject to any disclaimer, the term of this patent is extended or adjusted under 35 U.S.C. 154(b) by 0 days.

(21) Appl. No.: 13/822,214

(22) PCT Filed: Sep. 2, 2011

(86) PCT No.: PCT/IN2011/000601
§ 371 (c)(1),
(2), (4) Date: Mar. 11, 2013

(87) PCT Pub. No.: WO2012/029078
PCT Pub. Date: Mar. 8, 2012

(65) Prior Publication Data
US 2013/0222054 A1  Aug. 29, 2013

(30) Foreign Application Priority Data

Sep. 2, 2010 (IN) .......................... 2555/CHE/2010

(51) Int. Cl.
*H03K 5/00* (2006.01)
*H03H 11/02* (2006.01)
(Continued)

(52) U.S. Cl.
CPC .............. *H03H 11/02* (2013.01); *H03F 3/211* (2013.01); *H03F 3/45192* (2013.01); *H03F 3/45654* (2013.01); *H03F 2200/405* (2013.01); *H03F 2200/534* (2013.01); *H03F 2200/537* (2013.01); *H03F 2200/541* (2013.01); *H03F 2203/45418* (2013.01); *H03F 2203/45424* (2013.01);
(Continued)

(58) Field of Classification Search
USPC .................................................. 327/551–559
See application file for complete search history.

(56) References Cited

U.S. PATENT DOCUMENTS 5,880,634 A * 3/1999 Babanezhad .................. 330/126
6,084,440 A * 7/2000 Sousa .............................. 327/94
(Continued)

FOREIGN PATENT DOCUMENTS

CN           101309072           11/2008

OTHER PUBLICATIONS

International Search Report dated Mar. 1, 2012 for Application No. PCT/IN2011/000601.
(Continued)

*Primary Examiner* — Dinh Le
(74) *Attorney, Agent, or Firm* — Frost Brown Todd LLC

(57) ABSTRACT

An integrated continuous-time active-RC filter comprises a set of opamp integrators with Operational Transconductance Amplifiers (OTAs), and at least one assistant transconductor connected between an input and an output of each of the integrators of the set; wherein the assistant transconductor comprises a plurality of sets of MOSFETS connected in parallel to each other wherein each set of MOSFETS is formed by a pair of MOSFETs connected in series, with one MOSFET of the pair operating in the triode region and the other MOSFET of the pair operating in the saturation region; and wherein the assistant transconductor is configured to inject an assistant current into the output of each of the integrators in the set to enhance the linearity and speed of the opamp integrators of the set.

8 Claims, 17 Drawing Sheets

(51) Int. Cl.
*H03F 3/21* (2006.01)
*H03F 3/45* (2006.01)

(52) U.S. Cl.
CPC ............... *H03F2203/45512* (2013.01); *H03F 2203/45526* (2013.01); *H03F 2203/45528* (2013.01); *H03F 2203/45594* (2013.01); *H03F 2203/45702* (2013.01)

(56) References Cited

U.S. PATENT DOCUMENTS

| | | |
|---|---|---|
| 7,002,403 B2 | 2/2006 | Marholev |
| 7,692,484 B2 | 4/2010 | Terryn et al. |
| 2005/0052226 A1* | 3/2005 | Doerrer .................... 327/552 |
| 2008/0191778 A1 | 8/2008 | Huang et al. |
| 2013/0278230 A1* | 10/2013 | Ali et al. .................... 323/225 |

OTHER PUBLICATIONS

English Machine Translation of Chinese Publication No. CN 101309072.

* cited by examiner

LOW DISTORTION FILTERS

FIELD OF THE INVENTION

The present invention relates to the field of signal processing.

Particularly, the present invention relates to the field of active filters.

BACKGROUND OF THE INVENTION

Electronic filters are circuits which perform signal processing functions, specifically to remove unwanted frequency components from the signal, to enhance wanted ones, or both. There are different types of filters including analog or digital, active or passive, high-pass, low-pass, band-pass, band-reject, or all-pass, discrete-time (sampled) or continuous-time linear or non-linear infinite impulse response (IIR type) or finite impulse response (FIR type) and the like.

Passive filters make use of only passive components like resistors, capacitors and inductors whereas in Active filters, along with the aforesaid components, active components like Operational Amplifiers (opamps), Field Effect Transistors (FETs), Operational Tranconductance Amplifiers (OTAs) and the like are used. Active filters are implemented using a combination of passive and active (amplifying) components, and require an outside power source. Although active elements of the filters provide high linearity and a quality factor along with sharp resonance, their bandwidth is limited.

Integrated continuous-time filters have largely been realized using Transconductance-capacitance ($G_m$–C), active resistance capacitance (active-RC) or Transconductance–Operational Transconductance Amplifier-Capacitance ($G_m$–OTA–C) techniques. FIG. 1 illustrates a $G_m$–C integrator topology known in the art. $G_m$–C filters are capable of high speed operation due to the open loop nature of the integrators. However, good linearity is usually concomitant with high excess noise, resulting in poor power efficiency to achieve a given dynamic range. As such, their linearity is limited, and they add more noise than necessary from fundamental considerations. They are also sensitive to stray capacitances, as these parasitic capacitances appear in parallel with the integrating capacitors. These aspects have relegated such filters to those applications operating at high speeds but needing a low dynamic range.

FIG. 2 illustrates an active-RC integrator topology known in the art. Active-RC filters are attractive due to their low noise, high linearity and insensitivity to parasitic components, provided an opamp with a sufficiently high gain and bandwidth can be realized. Since every filter node is either a virtual ground or the output of an opamp, active-RC filters are largely insensitive to stray capacitances. In low voltage CMOS processes, it is difficult to realize an opamp with low output impedance that is capable of high swing operation. Therefore, OTA (Operational Transconductance Amplifier) with a sufficiently large transconductance are used in lieu of the opamp. Realizing a high speed OTA remains a key challenge. If the integrating resistor and capacitor as illustrated in FIG. 2 are linear, the only mechanism that results in filter distortion is the nonlinearity of the OTA. Due to the limitations on the realizable transconductance/bandwidth of the OTA, active-RC filters have largely been restricted to applications in low/moderate frequency range.

FIG. 3 illustrates a $G_m$–OTA–C integrator topology known in the art. The $G_m$–OTA–C technique is a hybrid of the $G_m$–C topology illustrated in FIG. 1 and the active-RC architecture illustrated in FIG. 2. The $G_m$ OTA–C technique reduces stray sensitivity and DC-gain problems associated with a $G_m$–C integrator. It however inherits the dynamic range issues including poor linearity and noise problems of the $G_m$–C design. Speed wise, $G_m$–OTA–C integrators are poorer than their $G_m$–C prototypes (due to the extra delay associated with the OTA), but perform better than their active-RC counterparts. Such an integrator always consumes more power (due to the OTA) than the $G_m$–C integrator it is based on, while having the same dynamic range. This results in a poor efficiency which is lower than that of the $G_m$–C integrator.

Therefore there is felt a need for a low distortion active filter with:
- combined advantages of active-RC and $G_m$–C integrators; and
- higher speed and linearity operation as compared to the conventional active-RC design.

OBJECTS OF THE INVENTION

An object of the invention is to provide a low distortion active filter that combines a $G_m$–C and an active-RC integrator.

Another object of the invention is to provide low distortion active filters that have enhanced linearity and speed as compared to active-RC integrators.

Still another object of the invention is to provide low distortion active filters that leverage the speed of $G_m$–C integrators.

Yet another object of the invention is to provide low distortion active filters that do not incur noise and distortion penalties of $G_m$–C integrators.

SUMMARY OF THE INVENTION

In accordance with the present invention, there is provided integrated continuous-time active-RC filter comprising a set of opamp integrators with Operational Transconductance Amplifiers (OTAs); the filter characterized by:

at least one assistant being connected between the input and output of each of the integrators of the set, the assistant adapted to provide an assistant current to be injected into the source of each of the integrators in the set, to enhance the linearity and speed of the opamp integrators of the set.

Typically, in accordance with this invention, the assistant comprises:

a plurality of sets of transconductors connected in parallel to each other; each set of transconductors being formed by a pair of MOSFETS connected in series, the pair comprising a MOSFET operating in the triode region and a MOSFET operating in the saturation region.

Typically, in accordance with this invention, the set of opamp integrators includes at least one single stage transconductor as the Operational Transconductance Amplifier (OTA).

Optionally, in accordance with this invention, the set of opamp integrators includes at least one Miller compensated two stage Operational Transconductance Amplifier (OTA), at least one two stage feed forward Operational Transconductance Amplifier (OTA) or the Operational Transconductance Amplifier (OTA) is implemented as a folded cascode structure.

Additionally, in accordance with the present invention, the set of opamp integrators drives resistive loads.

In accordance with the present invention, there is provided a method for limiting distortion in an integrated continuous-time active-RC filter comprising a set of opamp integrators with Operational Transconductance Amplifiers (OTAs), the method comprising the following steps:

connecting at least one assistant between the input and output of each of the opamp integrators of the set;

injecting an assistant current into the source of each of the integrators in the set, the assistant current being equal to the current that the integrators needs to source/sink; and driving the virtual ground voltage of the OTA to zero.

Typically, in accordance with the present invention, the step of connecting at least one assistant as described herein above further comprises the steps of:

connecting a pair of MOSFETS in series to form a set of transconductors;

operating a first MOSFET of the pair in the triode region and a second MOSFET of the pair in the saturation region; and connecting a plurality of the sets of transconductors in parallel to each other.

BRIEF DESCRIPTION OF ACCOMPANYING DRAWINGS

The invention will now be described in relation to the accompanying drawings, in which.

DETAILED DESCRIPTION OF THE ACCOMPANYING DRAWINGS

The invention will now be described with reference to the embodiment shown in the accompanying drawings. The embodiment does not limit the scope and ambit of the invention. The description relates purely to the exemplary preferred embodiment of the invention and its suggested applications.

The figures and description hereto are merely illustrative and only exemplify the invention and in no way limit the scope thereof.

Linearity of conventional active-RC filters is limited by the operational transconductance amplifiers (OTAs) used in the integrators. $G_m$–C filters are capable of high speed operation; however, their linearity is limited and they add more noise. They are also sensitive to stray capacitances. In accordance with the present invention, a $G_m$–C and an active-RC integrator are combined in a manner that enhances the linearity and speed of the latter, while adding negligible extra noise or power dissipation. Measurements from a fifth order Chebyshev filter with 20 MHz bandwidth designed in a 0.18 μm CMOS process show a 30 dB reduction in intermodulation distortion when $G_m$-assistance is added to an active-RC filter. Test results of the implemented embodiments are also explained herein below.

Figure 1:
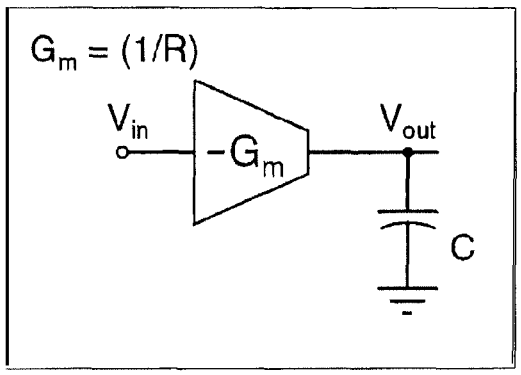
FIG. 1 illustrates a $G_m$–C integrator topology known in the art.
Figure 2:
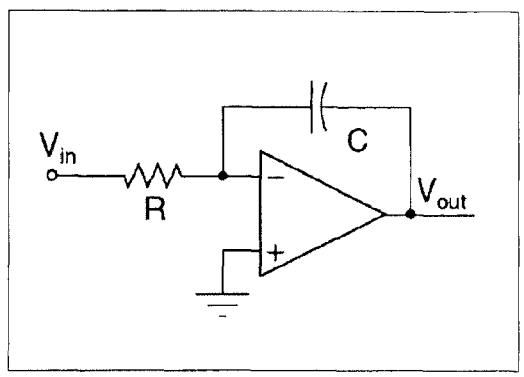
FIG. 2 illustrates an active-RC integrator topology known in the art.
Figure 3:
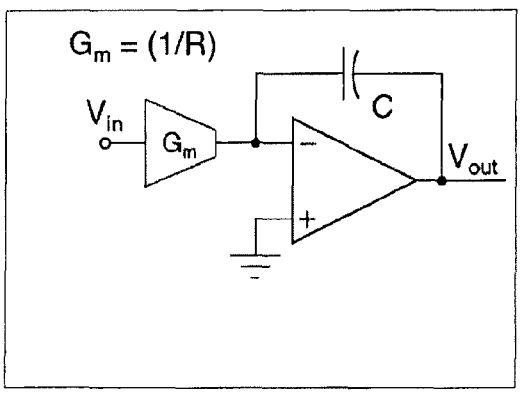
FIG. 3 illustrates a $G_m$–OTA–C integrator topology known in the art.
Figure 4:
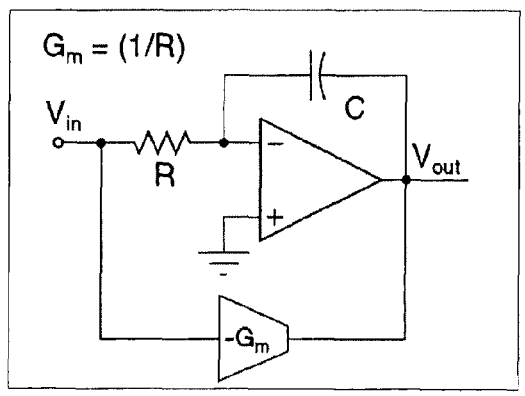
FIG. 4 illustrates a $G_m$-assisted OTA-RC integrator topology known in the art.

FIG. 1, FIG. 2, and FIG. 3 illustrate a $G_m$–C integrator, an active-RC integrator, and a $G_m$–OTA–C integrator topology respectively as known in the art. FIG. 4 illustrates a $G_m$-assisted OTA-RC integrator topology where a transconductor ($G_m$=1/R) draws a current $V_{in}/R$ from the output of the OTA, thereby assisting the active-RC integrator. Assuming a single stage OTA, the assisting transconductor obviates the need to source/sink current. Thus, the virtual ground potential remains zero, resulting in low distortion and high-speed operation. In practice, the assistant transconductor will add noise and distortion, but these are "absorbed" by the OTA (just like the noise of the OTA). Further, since every filter node is either a virtual ground or the output of an opamp, the integrator is less sensitive to parasitic capacitances. In essence, the $G_m$ assisted OTA-RC technique enhances the linearity and speed of an active-RC integrator by leveraging the speed of a $G_m$–C structure, without incurring the noise and distortion penalties of the latter.

Figure 6:
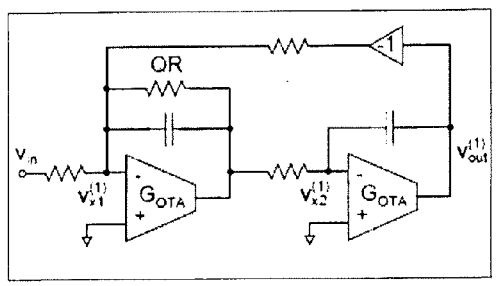
FIG. 6 illustrates a linear output of the active-RC filter of FIG. 5.
Figure 7:
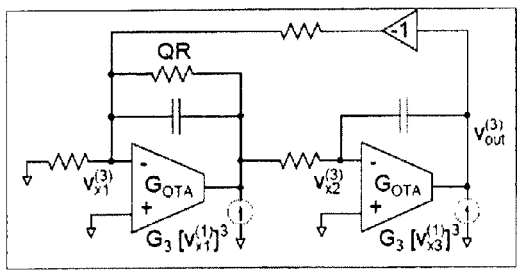
FIG. 7 illustrates a non linear output of after injecting a cubic current component into the linear filter of FIG. 6.

The linearity enhancement possible in a $G_m$ assisted integrator is explained herein below with reference to FIGS. 5-7, wherein the mechanism of distortion generation in an active network is illustrated with a first order active-RC filter. The OTA is assumed to be realized using a sufficiently large single stage transconductor, whose static output current assumed to be related to the virtual ground voltage as $i=G_{OTA}v_x-G_3 v_x^3$. All OTAs operate in a weakly nonlinear fashion, i.e, their inputs are such that $G_{OTA}v_x \gg G_3 v_x^3$. Only third order non-linearities are considered since the filter is differential. If the integrating resistors and capacitors are linear, the OTAs are the only sources of distortion.

When the filter is excited by $v_{in}$, the weakly nonlinear output is the sum of linear and nonlinear components $-v_{out}(t) \approx v_{out(1)}(t)+v_{out(3)}(t)$. The linear component, $v_{out(1)}(t)$, is the output of a linear filter ($G_3=0$) excited by $v_{in}$, as shown in FIG. 6.

Let the virtual ground voltages in this linear filter be denoted by $v_{x1(1)}(t)$ and $v_{x2(1)}(t)$. The nonlinear component $v_{out(3)}(t)$, is the resulting output of the linear filter excited by current sources $G_3[v_{x1(1)}(t)]^3$ and $G_3[v_{x2(1)}(t)]^3$ with $v_{in}=0$, as shown in FIG. 7.

Figure 5:
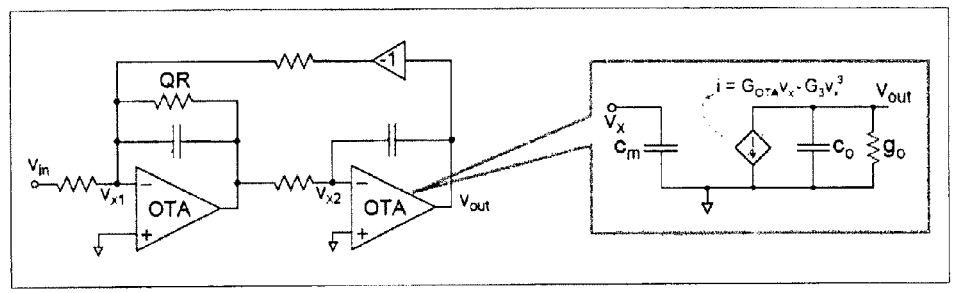
FIG. 5 illustrates an active-RC biquads filter known in the art.

Neglecting OTA parasitic capacitances, it is seen that the virtual ground voltages of FIG. 5 are inversely proportional to $G_{OTA}R$. This means that the injected nonlinear currents are proportional to $G_3/(G_{OTA}R)^3$. The transfer function from each of these currents to the output voltage of the corresponding integrators is inversely proportional to $G_{OTA}$. Therefore, the distortion of the filter is proportional to $G_3/(G^4_{OTA}R)^3$. From the mechanism of distortion generation discussed above, it is clear that reducing voltage swings at OTA inputs is the key to distortion free operation.

Figure 8:
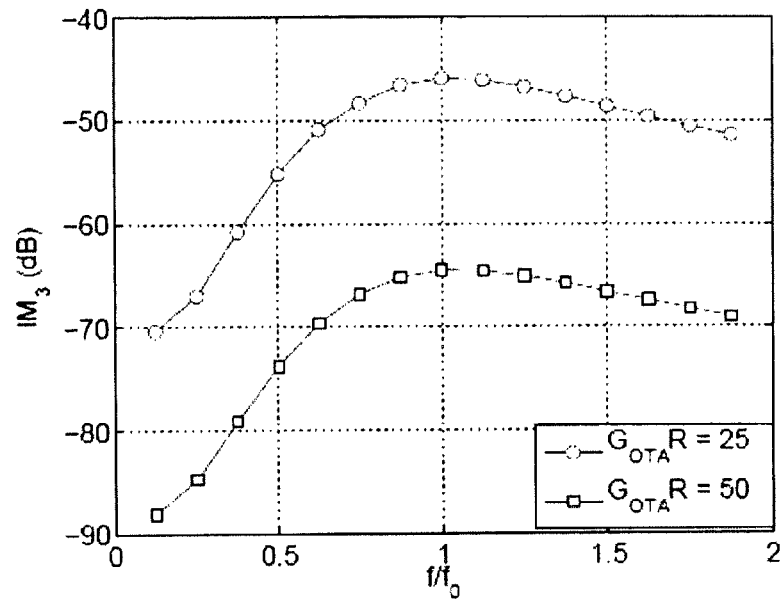
FIG. 8 illustrates a graphical representation of the third order intermodular distortion ($IM_3$) for two closely spaced tones with 375 mV peak amplitude as a function of average frequency of the tones normalized to 3 dB bandwidth of the filter.

A straightforward way of reducing voltage excursions at the virtual ground nodes is to scale the OTAs n-fold. This is accomplished by increasing the widths of all transistors in the OTA by a factor of n while maintaining the same bias voltages. This way, the swing limits of the OTA as well as the locations of the internal poles remain unchanged. $G_{OTA}$ and $G_3$ increase by a factor n at the expense of increased power dissipation. Ideally, this approach should reduce distortion by about a factor of $n^3$ (neglecting the increase in the input and output capacitances of the OTAs). To confirm this, the biquad of FIG. 5, realizing a Butterworth transfer function is simulated with a weakly nonlinear OTA. First, $G_{OTA}$ and $G_3$ are chosen as 25/R and 800/R respectively. For simplicity, the OTA parasitic capacitors and output conductances are set to zero. The passive component values are chosen so as to realize the desired band edge and quality factor compensating for the finite $G_{OTA}$. The third order intermodulation distortion ($IM_3$) for two closely spaced tones with 375 mV amplitude, as their average frequency is swept from $0.125f_0$-$1.875f_0$ is plotted in FIG. 8. As expected, the $IM_3$ is very small for low frequencies, reaching a maximum around $f_0$. The $IM_3$ when the OTA is scaled by $IM_3=2$ is also shown for comparison, and it is seen that the $IM_3$ is smaller by about 18 dB.

From the simulations above, it is seen that even for $G_{OTA}R=25$, without parasitic capacitances, and a relatively low Q needed for a Butterworth response, the filter linearity is modest. Higher order filters with sharper characteristics are bound to result in increased distortion. Scaling the OTA to reduce distortion leads to increased parasitic capacitances and conductances, which compromise the expected improvement in linearity. A common alternative is to use a two-stage Miller-compensated OTA—however, this also results in increased power and area.

A conventional method of reducing distortion in an active-RC filter is by increasing the loop gain of the integrator (either by scaling a single-stage OTA, or by using multiple stage OTA designs). A larger loop gain results in a smaller swing at the virtual ground node, improving linearity. In accordance with the present invention, $v_x(t)$ is reduced using a cancellation technique. The principle is explained using the linear model of an integrator shown in FIG. 9, where the OTA transconductance is denoted by GOTA(s). The input is represented by its Norton equivalent, and the output drives resistive and capacitive loads. If the current source labelled $i_{assist}$ is neglected, the virtual ground voltage $v_x$ is not zero, since the OTA needs to absorb the input current and supply the current needed by the load. $v_x$ can be zero only if GOTA=∞. However, if the OTA is "helped" by injecting at its output a current $i_{assist}$, which is precisely equal to the current it is called upon to source/sink, $v_x$ will be zero, despite GOTA being finite. Analysis of the integrator of FIG. 9 yields $$v_x(s) = \frac{G_1(G_L+s(C+C_L))v_{in}(s)-sCi_{assist}(s)}{G_1 G_L+s(G_1(C+C_L)+G_L(C+C_x)+G_{OTA}C)+s^2(CC_L+C_x C_L+CC_x)} \quad (1)$$

Where 's' is the variable of the transfer function.
If $v_x(s)=0$ then, $$\frac{G_1(G_L+s(C+C_L))v_{in}(s)-sCi_{assist}(s)}{G_1 G_L+s(G_1(C+C_L)+G_L(C+C_x)+G_{OTA}C)+s^2(CC_L+C_x C_L+CC_x)} = 0$$

Which implies $G_1(G_L+s(C+C_L))v_{in}(s)-sCi_{assist}(s)=0$, further implying $G_1(G_L+s(C+C_L))v_{in}(s)=sCi_{assist}(s)$.

Hence $i_{assist}(s)=[G_1 G_L/^-sC]v_{in}(s)+G_1[C+C_L]v_{in}(s)$ which further implies $i_{assist}(s)=[G_1 G_L/^-sC]v_{in}(s)+G_1[1+(C_L/C)]v_{in}(s)$ If $v_x(s)=0$, $v_{out}(s)=-[G_1/sC]v_{in}(s)$, then using equation 1 above, the assistant current $i_{assist}$ needed to make $v_x(s)=0$ is expressed as $i_{assist}=G_1[1+(C_L/C)]v_{in}(s)-G_L v_{out}$ \quad (2)

Figure 9:
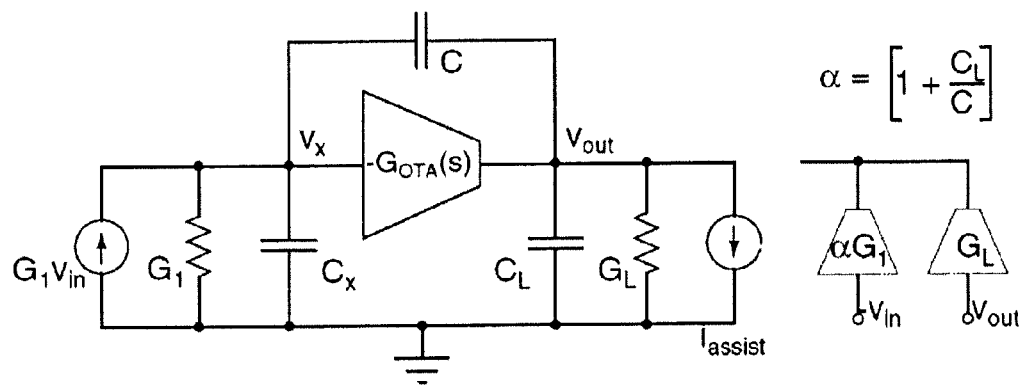
FIG. 9 illustrates a $G_m$-assisted OTA-RC integrator in accordance with the present invention.

The equation (2) above indicates that the assistant current $i_{assist}$ is generated by assistant transconductors $G_1[1+(C_L/C)]$ and $G_L$ driven by $-v_{in}$ and $v_{out}$ respectively as illustrated by the gray box in FIG. 9. For an ideal integrator with OTA, $G_{OTA} \gg G_1$ and $G_{OTA} \gg G_L$. If the correct assistant current is injected, an ideal $G_m$-assisted OTA-RC integrator transfer function is realized. As the implementation of the transconductors require little extra power, the $G_m$-assisted OTA-RC integrator enhances the linearity and speed of the active-RC integrator in a power efficient manner.

Figure 10:
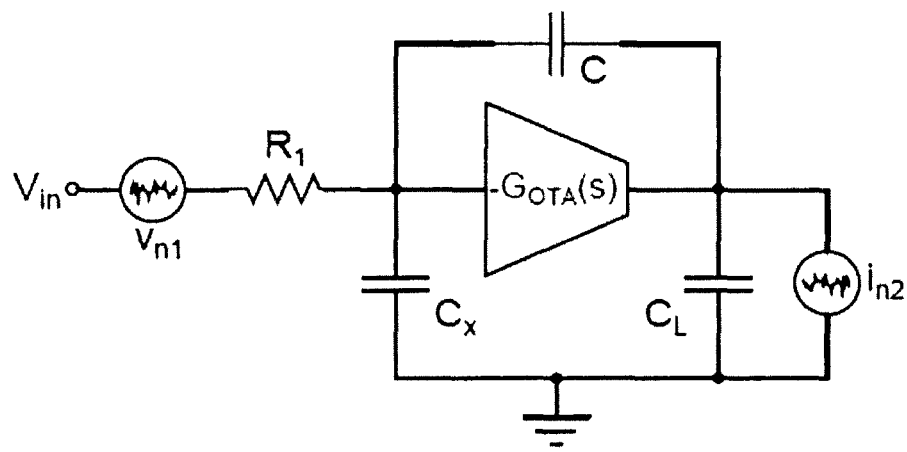
FIG. 10 illustrates an equivalent of FIG. 9 for stability and noise analysis.

From FIG. 9 it is seen that the assistant current has components proportional to the input and output voltages of the integrator. The input current component does not affect the stability of the integrator. The output current component compensates for the current lost through the load resistor, and behaves like a negative resistance of value $-R_L$. FIG. 10 illustrates an equivalent circuit for FIG. 9 in relation to stability (and noise analysis).

The characteristic polynomial of the system can be written as $$D(s)=s(((C+C_L)/G_{OTA})+C/G_1))+s^2((CC_L+C_xC_L+CC_x)/G_1G_{OTA}) \quad (3)$$

The assistant transconductors $G_1[1+(C_L/C)]$ and $G_L$ do contribute noise and distortion to the filter system. The noise current of the integrating resistor is denoted by $i_{n1}$ and $i_{n2}$ represents the noise current of the OTA and the assistant transconductor.

The input referred voltage spectral noise density is given by $$S_{vin}(f) = 4kTR_1 + 4kT(\eta_1/G_{OTA})(1+(\eta_2 G_{assist}/\eta_1 G_{OTA})) \quad (4)$$
$$(1+4\pi^2f^2((C+C_x)/G_1)^2/1+4\pi^2f^2((C)/G_{OTA})^2$$

Where $G_{assist}$ is the transconductance of the assistant transconductor and $\eta_1$ and $\eta_2$ are the excess factors of the OTA and assistant transconductor respectively. (The noise current of a transconductor $G_m$ has a spectral density $4\eta kTG_m$, where $\eta$ denotes the excess noise factor). In a well designed integrator, $G_{OTA} \gg \{G_1, GL, Gassist\}$.

Hence it is concluded that:
(i) the noise contribution of the OTA to the integrator output noise is small, and
(ii) the noise contribution of the assistant transconductor which appears parallel to the OTA is much smaller than the OTA noise current.

It can be concluded that the adaptation of assistant transconductors enhances the performance of the filter with negligible excess noise. However, the assistant adds its own distortion.

Figure 11:
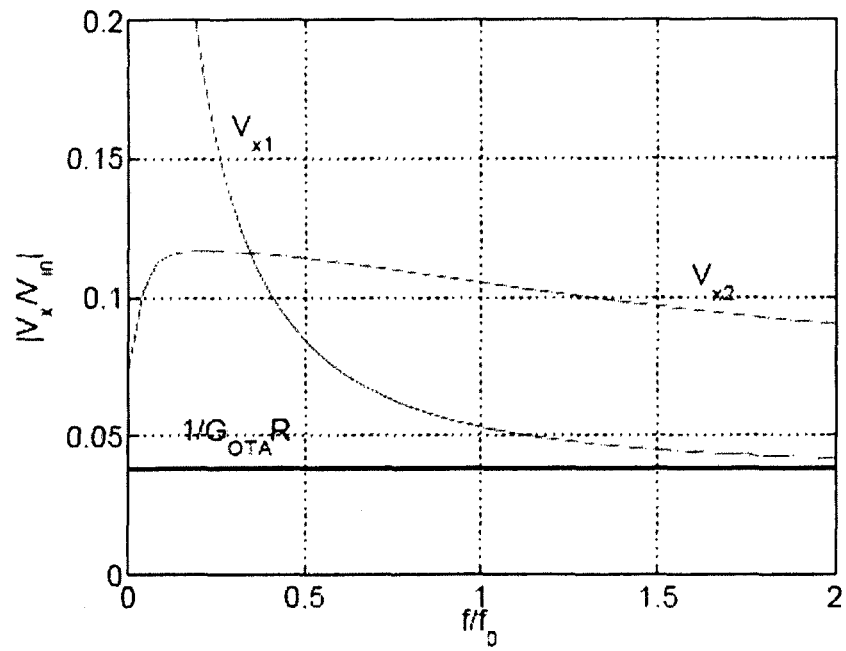
FIG. 11 illustrates gains from the inputs of the integrators of the second order biquads of FIG. 5 to their respective virtual ground nodes.

Referring to FIG. 9, if $G_L$, $C_L$ and $C_X$ are all zero, the virtual ground potential of the integrator is $V_{in}(G_1/(G_1+G_{OTA}))$. For non-zero load conductance/capacitance, this voltage will be larger and frequency dependent. However, for large $G_{OTA}/G_1$, the swing at the virtual ground can be approximated by a relation of the form $\beta v_{in}G_1/G_{OTA}$, where $\beta > 1$. Further, the ratio of the stimulated virtual ground voltages to the respective integrator inputs for the biquad of FIG. 5 is illustrated in FIG. 11. The ratio $G_1/G_{OTA}$ is also shown for comparison confirming the relation $\beta \gg 1$. The distortion introduced by the transconductors must be smaller than that introduced by the OTA in a conventional active-RC integrator. If the i–v relationship of the assistant is written as $i_{assist}=G_a v_i - G_{3a} v_i^3$, $G_{3a}$ should satisfy $$G_{3a} < G_3(\beta G_1/G_{OTA})^3 \quad (5)$$

The inequality represented by (5) herein above is easy to achieve in integrators using single-stage OTAs when $G_{OTA}$ is chosen to be modest (to save power). If the distortion of the $G_m$-assisted OTA–C integrator is largely from the transconductor, then it is analytically evident that the distortion generated by the transconductor is attenuated approximately $G_{OTA}/(sC)$ at the integrator output.

Figure 12:
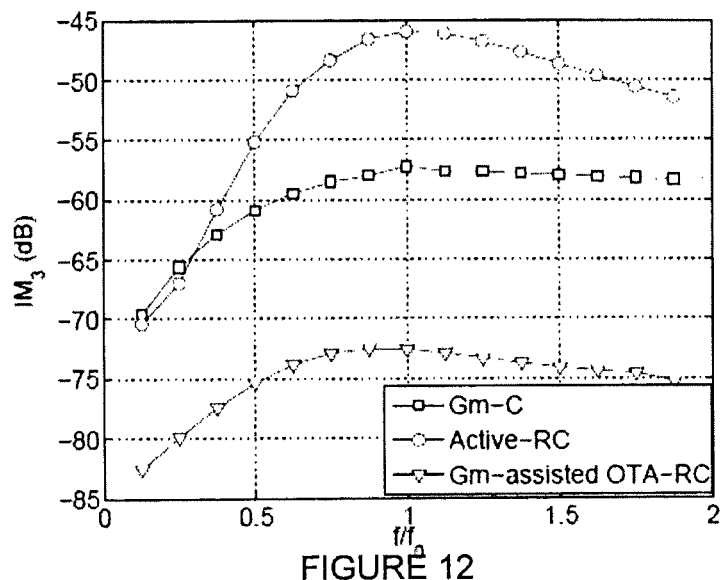
FIG. 12 illustrates a graphical representation of the third order intermodular distortion ($IM_3$) for an active-RC filter (without assistance), $G_m$–C and $G_m$-assisted OTA-RC biquads as a function of average frequency of the tones.

Further, referring to FIG. 12, the $IM_3$ of biquads a comparative study is carried out between (i) active-RC integrators without $G_m$-assistance (with $G_{OTA}$=25/R and $G_3$=800/R), (ii) active-RC integrators with $G_{OTA}$=25/R but assisted by weakly non-linear transconductors with $G_a$=1/R and $G_{3,a}$=$10^{-2}$/R and (iii) $G_m$–C integrators with transconductors having $G_m$=1/R and $G_{3,m}$=$10^{-2}$/R. FIG. 12 illustrates that $G_m$-assisted OTA-RC biquad is the most linear of the three structures. Further, the noise of the $G_m$-assisted OTA-RC is similar to the active-RC filter (which is not true for the $G_m$–C design). It is thus concluded that the OTA and the transconductor in a $G_m$-assisted OTA-RC structure share a symbiotic relationship, where the advantages of the $G_m$–C and OTA-RC structures are combined.

Figure 13:
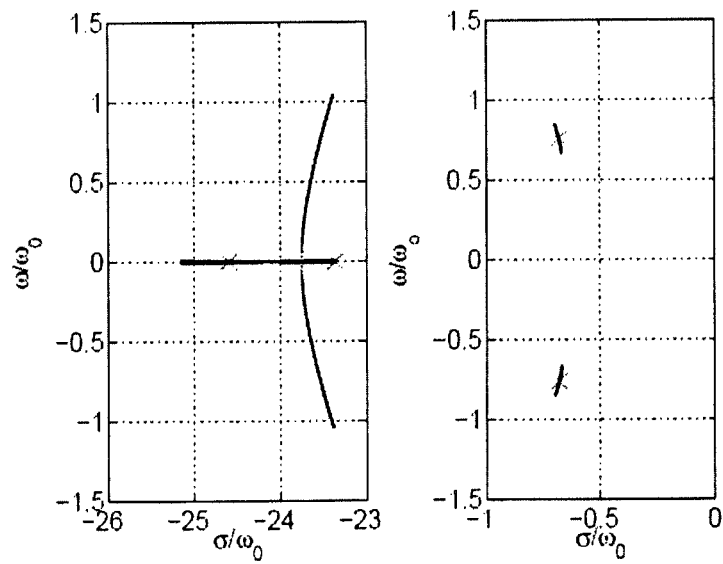
FIG. 13 illustrates loci of the poles of a Butterworth biquad with mismatch in assistant currents.
Figure 14:
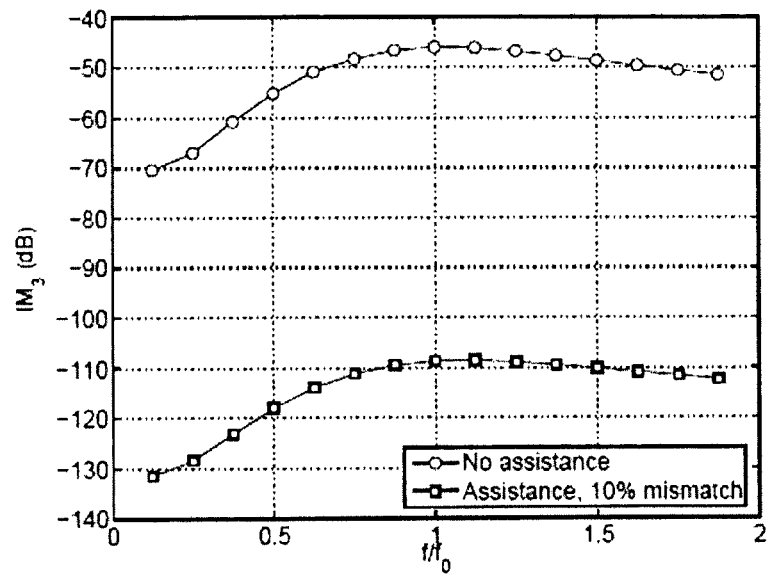
FIG. 14 illustrates a graphical representation of measured intermodulation distortion ($IM_3$) of a Butterworth biquads without and with assistance, the assistant transconductors being mismatched by 10%.

The enhanced performance of the $G_m$-assisted-OTA-RC integrator is explained on the basis of cancellation principle. Referring to FIG. 9, if the transconductor compensating for the current through $G_L$ exceeds its nominal value, the result is a net negative resistance load presented to the output of the OTA. To study the effect of mismatch between the main filter and the assistant transconductors, the pole positions of a Butterworth biquad were determined as the strength of the assistant transconductors was varied from 50% to 150% of their nominal values (corresponding to a mismatch of +/−50%). The integrators were of the type as shown in the FIG. 9. The integrating capacitors are chosen to be equal and denoted by C with $G_{OTA}/G_1$, $C_x$ and $C_L$ being 25, 0.05 and 0.1 C respectively. As each integrator of the filter system drives the other, $G_L=G_1$. Due to the parasitic capacitances of the OTA, the biquad is actually a fourth order system. The loci of the poles are as shown in FIG. 13. The parasitic poles are at high frequencies (about 25 times the filter bandwidth). The crosses indicate the pole positions for the nominal values of the assistant transconductors. It is seen that the pole are well within the left half s-plane, even with +/−50% mismatch. The change in the quality factor of the poles is also small. This is because, at low frequencies, the overall negative feedback in the biquad makes the Thevenin resistance looking into each OTA output very small ($G_1/G^2_{OTA}$). Thus the negative resistance (of the order of $1/G_1$) will not result in a net negative resistance at the OTA output node. At high frequencies, the output resistance of the OTA approaches $1/G_{OTA}$, as the integrating capacitors behaves like short circuits. Since $G_{OTA}/G_1 \gg 1$, the negative load resistance does not result in instability. Further, assuming that the assistant transconductors fall short of their desired values by a fraction $\alpha$, the OTA transconductance appear $1/\alpha$ times larger. FIG. 14 illustrates a graphical representation of measured intermodulation distortion ($IM_3$) of a Butterworth biquads without and with assistance, the assistant transconductors being mismatched by 10%. $G_{OTA}R$ and $G_3$ were selected to be 25 and 800/R respectively with 10% mismatch introduced in the assistant transconductors. The results depicted in the FIG. 14 support the ideation of the present invention.

Figure 15:
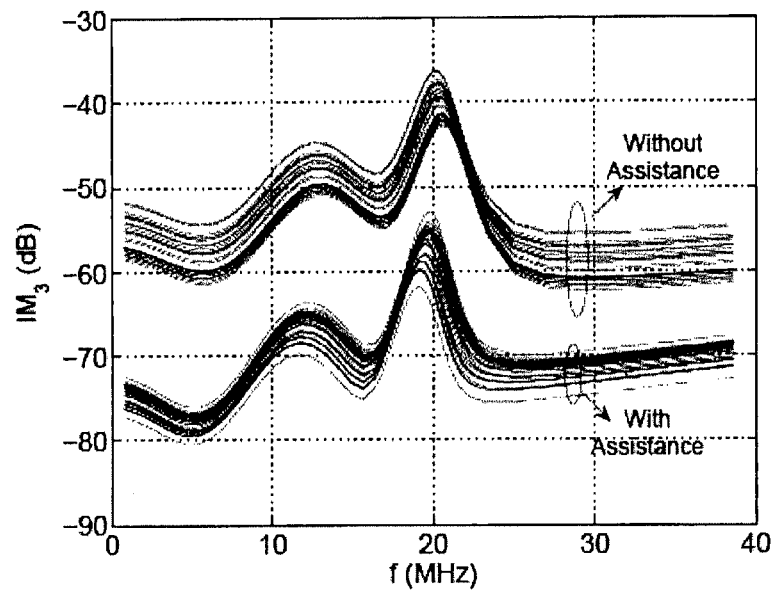
FIG. 15 illustrates a graphical representation of measured intermodulation distortion ($IM_3$) for a fifth order 20 MHz Chebyshev filter with a passband ripple of 1 dB with/without assistance.

To test the robustness of the $G_m$-assisted-OTA-RC integrator, Monte Carlo intermodulation simulations (25 trials) were run for a fifth order 20 MHz Chebyshev filter with a passband ripple of 1 dB. Each of the two closely spaced tones have a peak amplitude of 375 mV. The $IM_3$ without transconductor/with transconductor assistance is illustrated in FIG. 15. The OTA is a single stage folded-cascode design and the assistant transconductor is incorporated into the OTA without incurring extra power dissipation. The tail current of the OTA and the assistant transconductance ($G_a$) are assumed to be random variables with a standard deviation of 10% of their nominal values. As the tail current for the differential pair changes, the $IM_3$ (without transconductor assistance) is effected on two counts-$G_{OTA}$ and $G_3$ change, varying the OTA's loop gain and its inherent linearity respectively. For a differential pair OTA with a tail current of $I_{tail}$, assuming square law behaviour for the transistors, it can be shown that $G_{OTA}/G_3 \propto I_{tail}$. Further, since $G_{OTA} \propto \sqrt{I_{tail}}$, it implies $IM_3 \propto (I_{tail})^{-2\cdots5}$. Moreover, when the assistance is used, the distortion reduces by about 17 dB. The $IM_3$ is now largely dependent on the distortion of the assistant (qualified by $G_{3,a}$), which is attenuated by a factor proportional to $1/G_{OTA}$ (which depends on $(I_{tail})^{-0.5}$). This reduces spreading. The standard deviation of the $IM_3$ is 1.25 dB. It can be concluded from the preceding discussion that $G_m$-assisted-OTA-RC technique based on cancellation is robust with respect to small changes in element values.

Figure 16:
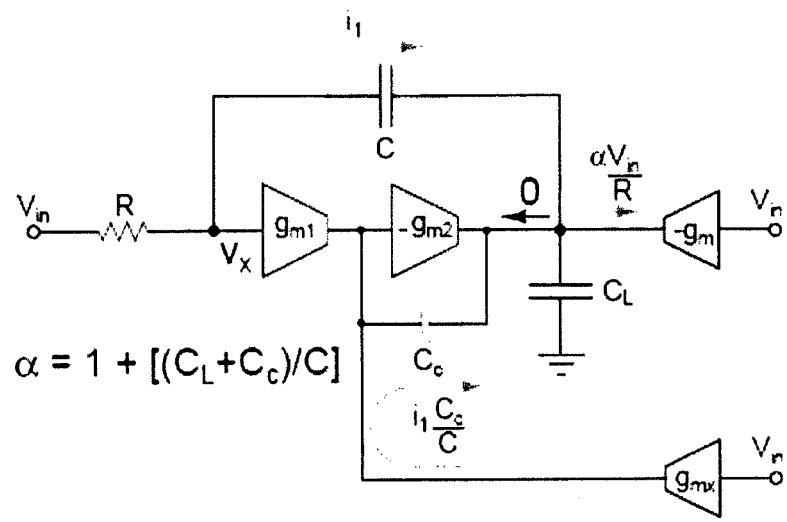
FIG. 16 illustrates $G_m$-assistance applied to active-RC integrators based on Miller compensated OTA.
Figure 17:
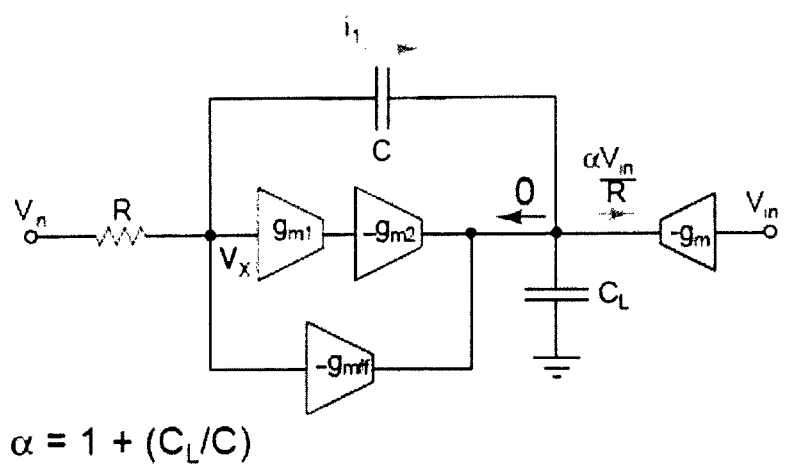
FIG. 17 illustrates $G_m$-assistance applied to active-RC integrators based on feedforward compensated OTA.

The $G_m$-assistance technique in accordance with the present invention is applicable to other OTA topologies like Miller-compensated-OTA based integrator and the Feed-forward-compensated-OTA based integrator as illustrated in FIG. 16 and FIG. 17 respectively where $G_L$ is chosen to be zero for simplicity. The voltage across the integrating and compensating capacitors are approximately the same for the Miller-compensated OTA based integrator. This implies that the current through the compensating capacitor is approximately $i_1(C_c/C)$, which must be supplied by the input transconductor of the OTA. The virtual ground voltage is therefore given by $i_1(C_c/g_{m1}C)$. Hence, when compared to a single-stage OTA, the effective transconductance of a Miller compensated OTA appears amplified by a factor $C/C_c$. Moreover, to incorporate $G_m$-assistance, two assistants are needed. One assistant prevents the second stage from delivering current and another prevents the input transconductor from having to supply the current $i_1(C_c/C)$. The integrator based on a Feed-forward-compensated-OTA based integrator as illustrated in FIG. 17, however needs a single assistant transconductor.

Figure 18:
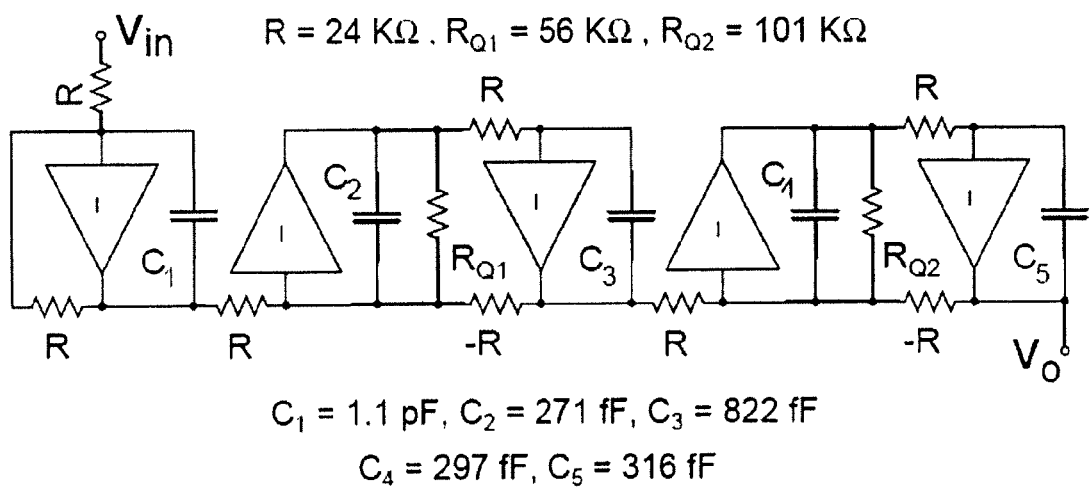
FIG. 18 illustrates a single ended equivalent of the fifth order Chebyshev filter having a passband ripple of 1 dB and a band-edge frequency of 20 MHz.

The circuit design aspects of the $G_m$-assisted OTA-RC integrator is envisaged as illustrated in FIG. 18 wherein a single-ended equivalent of a fully differential structure is shown. The negative resistances indicate inversion of the corresponding signals in the differential equivalent. The resistors and capacitors were realized as digitally switch able banks to tune out RC variations over process and temperature (PVT). The integrators used a single-stage transconductor as the OTA for simplicity as a Miller compensated OTA would have complicated the assistant circuitry as two assistants are needed and the transconductor assisting in first stage must have a value $(C_c/RC)$. Further, when the integrating capacitor is tuned to compensate for process variations, the compensation capacitor $C_c$ would also have to be tuned to keep the assistant transconductor fixed. However, $C_c$ is small, making it impractical to realize as an array. Moreover, using a Feed-forward compensated OTA is also not preferred as it has a limited output swing.

The OTA was implemented as a folded cascode structure (as opposed to the differential pair) to increase the output swing capability of the integrator. Further, folding also conveniently allows the assistant transconductors to be incorporated into the design. To enable a good assessment of the benefits to be had from OTA "assistance", a conventional active-RC filter and a $G_m$-assisted active-RC filter were designed using the same folded cascode.

Figure 19:
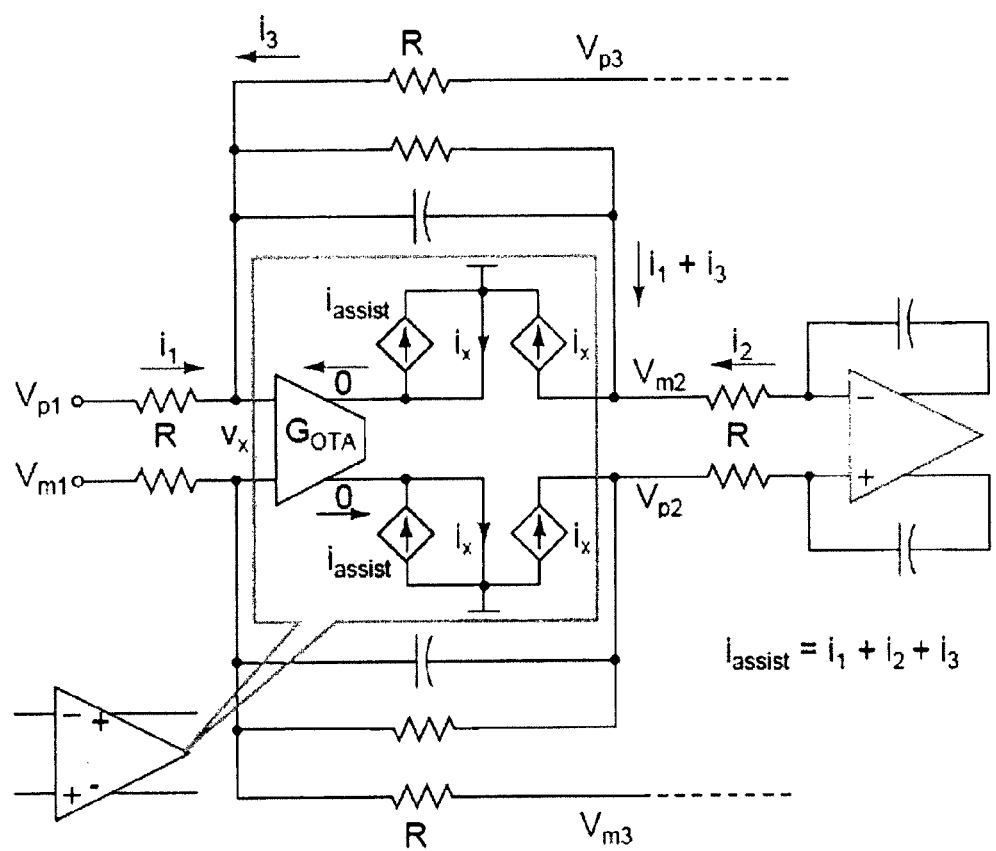
FIG. 19 illustrates an OTA embedded in an active-RC filter.

A section of the active-RC filter as illustrated in FIG. 19 is considered to better explain the $G_m$-assisted OTA technique ideated in the present invention. A damped summing integrator drives a subsequent integrator. The grey box illustrated in FIG. 19 indicates the internals of the folded cascode OTA. It consists of a transconductance $G_{OTA}$ and a current—controlled current source. The current controlled current source has a framework of common-gate stage used to fold the transconductor output. The value of $G_{OTA}R$ is selected to be 25 for the ideated work as $G_{OTA}R\gg1$ for a well designed filter. The value of the $i_{assist}$ is non-zero unlike the conventional designs (without $G_m$-assistance) where $i_{assist}$ is zero.

Further, the outputs of the integrator need to source/sink a current $i_1+i_2+i_3$. It implies that with a finite $G_{OTA}$, a non-zero voltage $v_x$ is needed at the input of the OTA. To improve filter linearity, the magnitude of $v_x$ should be reduced. In the present invention, $i_{assist}=i_1+i_2+i_3$ is injected at the output of the first stage of the OTA. It implies, the current that needs to be supplied by the input stage of the OTA becomes zero leading to zero $v_x$ voltage at the input of the OTA thus eliminating the distortion. The assistant currents ($i_1$, $i_2$, $i_3$) are generated using the transconductors (with $G_m=1/R$) excited by $V_{p1,m1}$, $V_{p2,m2}$ and $V_{p3,m3}$.

Figure 20:
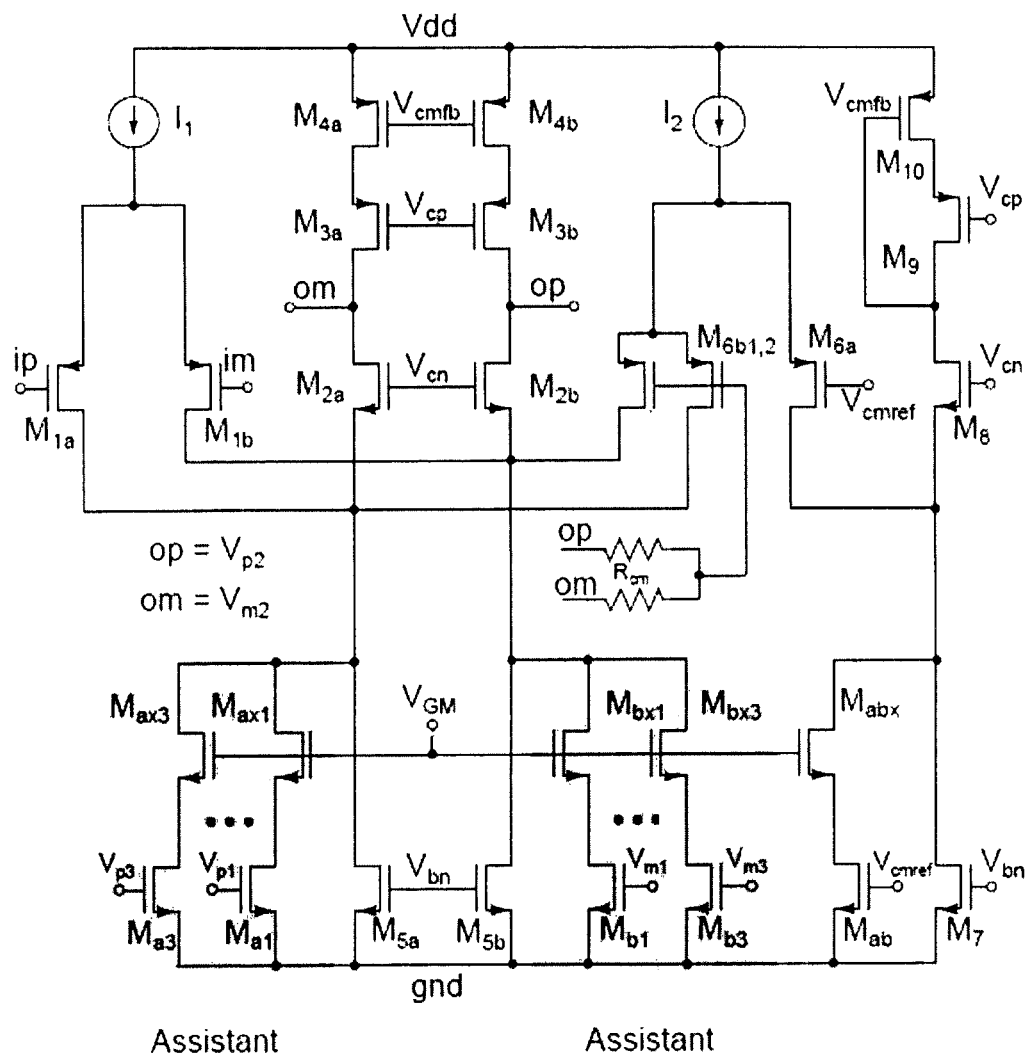
FIG. 20 illustrates a schematic of a folded cascode OTA incorporating 'assistant' transconductors in accordance with the present invention.

The schematic of the $G_m$-assisted OTA-RC ideated in the present invention is schematically illustrated in FIG. 20. A P-channel MOSFET input pair ($M_{1a,b}$) was chosen for low 1/f noise. $M_2$ and $M_3$ represent the P-channel MOSFET and N-channel MOSFET cascodes. The common-mode feed back (CMFB) network comprises of MOSFETs $M_6$ through $M_{10}$. Since a large differential swing is expected at the OTA input, a resistive common-mode detector is used. The CMFB circuitry injects current at the sources of $M_2$ and also varies the gate voltages of $M_{4a,b}$. This type of CMFB results in accurately balanced outputs even at high frequencies. Further, the output common-mode level remains set at $V_{cmref}$ even when the input is momentarily off (at start up or due to supply transients).

The assistant transconductors are formed by a set of MOSFETS $M_{a1}$–$M_{ax1}\ldots M_{a3}$–$M_{ax3}$ and $M_{b1}$–$M_{bx1}\ldots M_{b3}$–$M_{bx3}$ as shown in the said boxes in FIG. 20. $M_{a1\text{-}a3}$ and $M_{b1\text{-}b3}$ are native devices operating in the triode region, while $M_{a1\text{-}ax3}$ and $M_{bx1\text{-}bx3}$ operate in saturation. $M_{ab,abx}$ add a current to the CMFB circuitry so that $M_{9,10}$ operate with the same current density as $M_{3,4}$. The differential inputs of three assistant transconductors are $V_{p1,m1}$, $V_{p2,m2}$ and $V_{p3,m3}$. Considering the transconductor half-circuit formed by $M_{a1}$–$M_{ax1}$ and assuming the source of $M_{ax1}$ is incremental ground, it is seen that the transconductance is given by $g_{ma}=\mu_n C_{ox}(W/L)_1 V_{x1}$, where $V_{x1}$ is the quiescent potential at the source of $M_{ax1}$. To ensure that $g_{ma}$ tracks $(1/R)$ across process variations and temperature, $V_{GM}$ is derived from a control loop that servoes $g_{ma}$ to $(1/R)$. This transconductor topology offers good linearity. Finite $g_m$ of $M_{ax,1\text{-}3}$ and $M_{bx,1\text{-}3}$ makes the transconductor exhibit expansive characteristics. This results in distortion currents that are opposite in phase to other nonlinear components arising from compressive nonlinearities. The assistant currents are injected into the sources of $M_{2a,b}$ rather than directly at the OTA output. This relaxes the output impedance requirements of the assistants. As the transconductance of assistants is $(1/R)$, only a fraction of the quiescent current of the output stage is needed to implement them. Each folded cascode OTA consumes 0.5 mA of current, out of which 40% is drawn by the input pair.

Further, referring to FIG. 19, the damped integrator of the biquad needs three assistant transconductors; one each for compensating the input current, for compensating the current from the undamped integrator and for the current to be supplied to the undamped integrator. Similarly, the undamped integrator needs three assistant transconductors; one for compensating the input current and the other two for driving the resistors that feed into damped integrator and the following biquad.

Two versions of the filter were fabricated for testing purposes; one version being with assistance from the transconductor and the other version being without assistance from the transconductor. The MOSFETs in the shaded box in FIG. 20 as well as $M_{ab}$ and $M_{abx}$ were removed in the non-assisted filter.

The $G_{OTA}R$ product of the integrators is modest as the filter design under consideration is a single stage OTA design. Also, the $G_{OTA}R$ product is maintained fixed so as to maintain the shape of the frequency response over process variations and temperature (PVT). The $G_{OTA}R$ product is made constant by servoing the transconductance of the differential pair to a master resistor which is identical to the integrating resistor. This resistor was chosen to be an external chip.

Figure 21:
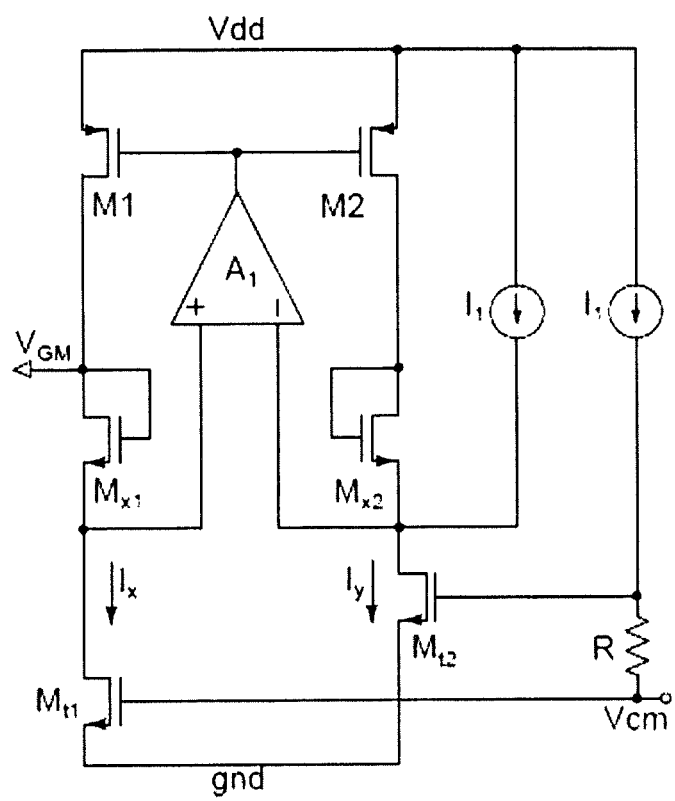
FIG. 21 illustrates a simplified circuit diagram of a bias generator with a servo loop that tracks the transconductance of the assistants to 1/R.

The transconductance of the assistants must track 1/R over process variations and temperature (PVT). A servo loop was made to vary the $V_{GM}$. The simplified schematic of the circuit is shown in FIG. 21. The MOSFETs $M_1$ and $M_2$ have the same sizes. The MOSFETs $M_{x1,x2}$ and $M_{t1,t2}$ are identical devices that are replicas of $M_{ax1}$ and $M_{b1}$ illustrated in FIG. 20 respectively. The circuit illustrated in FIG. 21 includes a servo operational amplifier $A_1$ having a high gain and a negative fee back operation. The drain potentials of the triode devices $M_{t1}$ and $M_{t2}$ are equal. The currents through $M_{x1}$ and $M_{x2}$ are equal. It implies that the difference in current $I_y-I_x$ will be equal to $I_1$. However, the difference in the drain currents through $M_{t1}$ and $M_{t2}$ should be equal to $g_{ma}\Delta V_{GS}$ which is equal to $g_{ma}I_1R$. This results in $g_{ma}$ being maintained at 1/R. The gate potential $V_{GM}$ of $M_{x1,x2}$ is distributed to the OTAs in the filter. R is the replica of the digitally tuned banks used for the integrating resistors.

Figure 22:
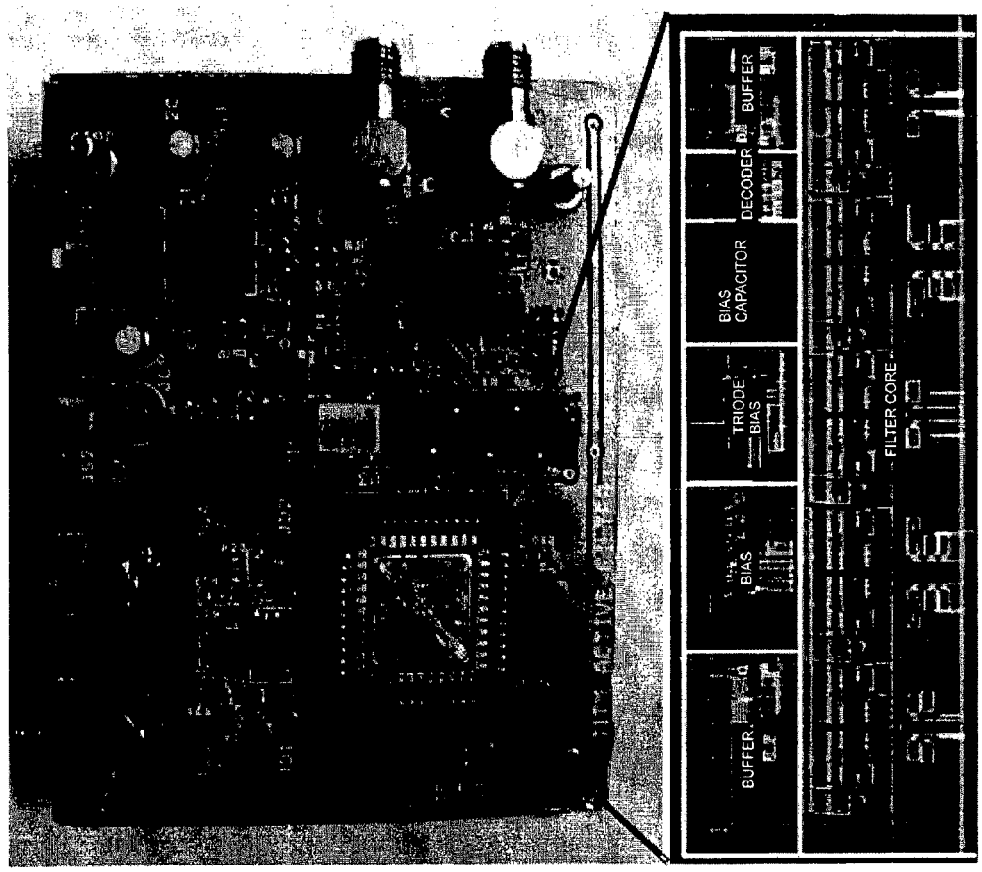
FIG. 22 illustrates a layout of the filter (with assistance) in accordance with the present invention and the test board used for characterization.

FIG. 22 illustrates a layout of the filter (with assistance) in accordance with the present invention and the test board used for characterization. The test chip was fabricated in a 0.18 μm CMOS process through the Euro practice program. A 44-pin J-Lead chip Carrier (JLCC) was used to package the chip. The test chip consisted of two filters. One filter was a conventional single stage folded cascade OTA without assistant transconductors and the other a single stage OTA with $G_m$ assistance incorporated into the design. The integrating capacitors of each filter were predistorted so that the desired fifth order response was obtained even with finite transconductance for the OTAs. Both versions of the filter occupy the same core area of about 0.20 mm².

Figure 23:
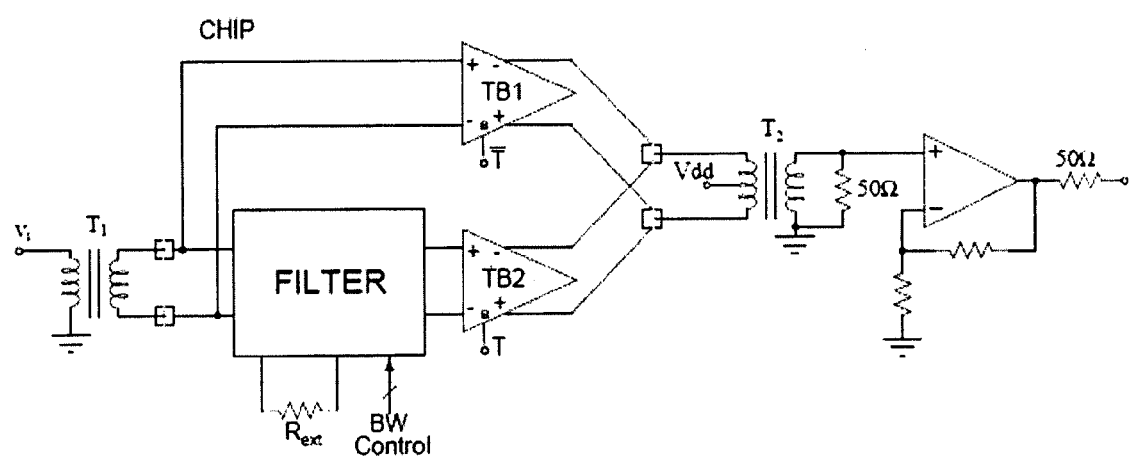
FIG. 23 illustrates a schematic of the test setup used to characterize the filter (with assistance) in accordance with the present invention.

FIG. 23 illustrates a schematic of the test setup used to characterize the filter (with assistance) in accordance with the present invention. $T_1$ and $T_2$ are baluns that enable interfacing of the filter with single ended test equipment. $TB_1$ and $TB_2$ are on-chip test buffers that sense the input and output of the filter respectively. Only one of them is active at any time. To prevent errors in measurement due to package feed through, the gain of the buffers can be multiplied by +/−1. To have accuracy in distortion measurements, the test buffers are needed to be more linear than the filter. Attenuators are used inside $TB_1$ or $TB_2$ to achieve this. The small signal drives a differential pair connects to the pads in an open-drain fashion. The single ended output of $T_2$ is amplified on the test board. For noise characterization, the output of $T_2$ is further amplified by a minicircuit broadband amplifier module. The master resistor, to which the transconductance of the OTAs is slaved, is external to the chip which allows to vary the $G_{OTA}$.

Figure 24:
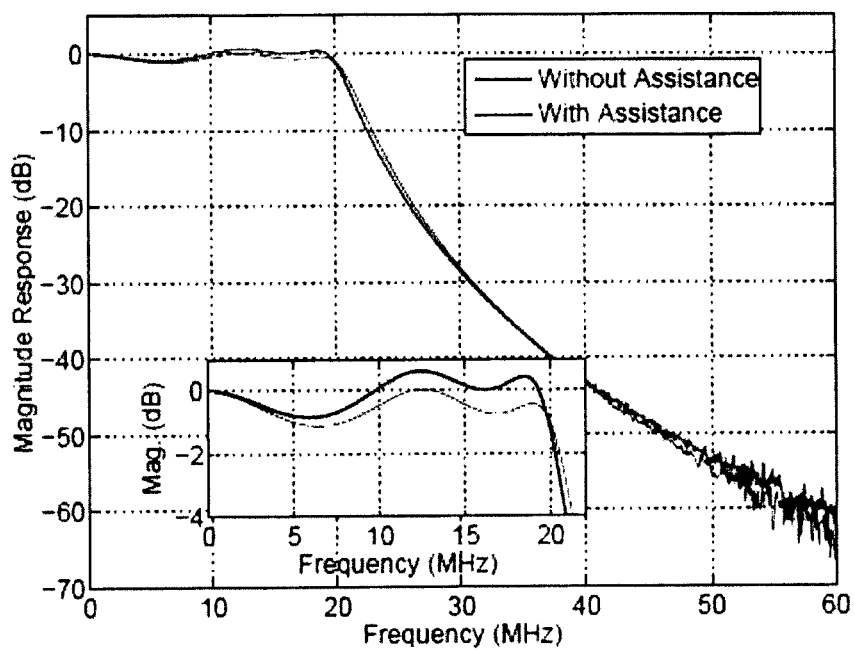
FIG. 24 illustrates a graphical representation of the measured frequency responses of the filters with/without assistance with the inset illustrating the pass band detail.

FIG. 24 illustrates a graphical representation of the measured frequency responses of the filters with/without assistance with the inset illustrating the pass band detail. The passband exhibits equiripple characteristics and the stop band exhibits good attenuation.

Figure 25:
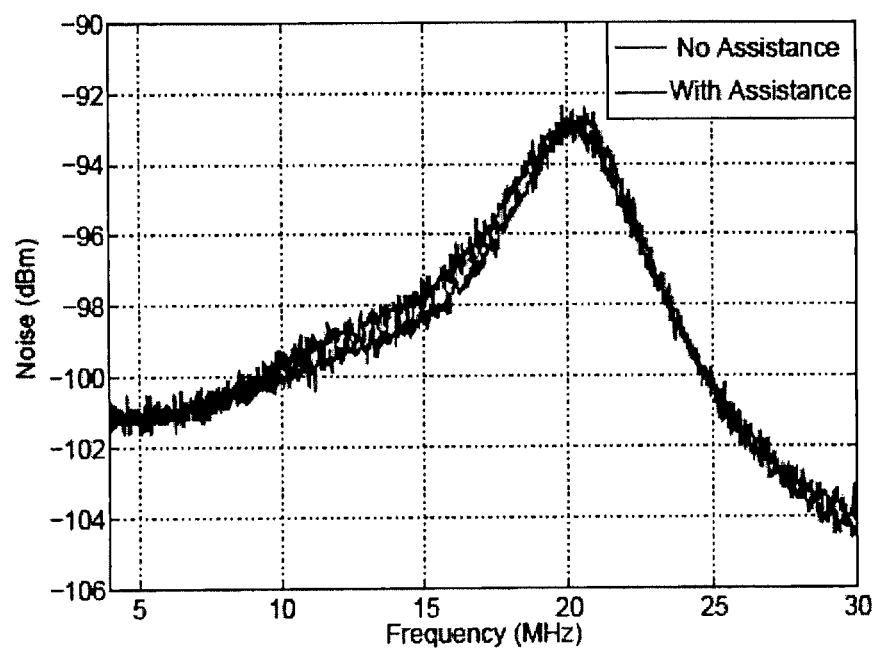
FIG. 25 illustrates a graphical representation of the measured output noise spectral densities of the filters with/without assistance.

FIG. 25 illustrates a graphical representation of the measured output noise spectral densities of the filters with/without assistance. The spectral density is the same for both filters.

The output RMS noise which gives the gain from the filter output to the spectrum analyzer input is about 1 mV for both the filters.

Figure 26:
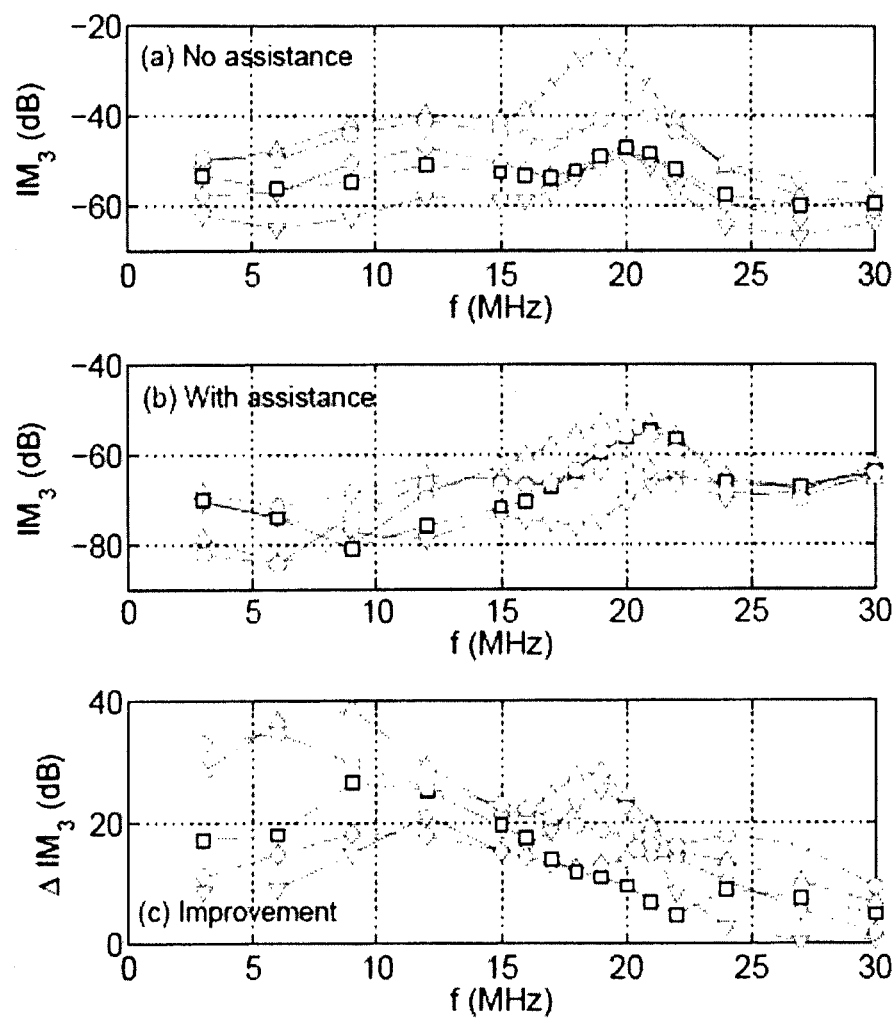
FIG. 26 illustrates a graphical representation of measured intermodulation distortion ($IM_3$) of five chips (a) without assistance, (b) with assistance and (c) the improvement due to assistance.

FIG. 26 illustrates a graphical representation of measured intermodulation distortion ($IM_3$) of five chips (a) without assistance, (b) with assistance and (c) the improvement due to assistance. To determine the third order inter modulation distortion ($IM_3$), two tones with peak value of 750 mV with a separation of 0.4 MHz are used. It is clear from the illustration that using assistance results in a significant reduction in distortion with an average improvement of about 15 dB in the passband. This is in accordance with expectations from simulations. Further, for the filter with assistance, it is seen that beyond 22 MHz, the $IM_3$ starts to increase again. This is from the active power combiner used to generate the two tone signal. Also from the diagram, it is clear that there is a strong correlation between the performance without and with assistance (a chip that performs poorly without assistance also performs poorly with it, even though the distortion reduces with assistance). This is due to the random offset in the resistor servo loops. The spread in the $IM_3$ with assistance is smaller than that without assistance. Further, an improvement of only around 15 dB indicates the fact that the nonlinearity of the assistants is a major factor that limits the performance achievable.

Figure 27:
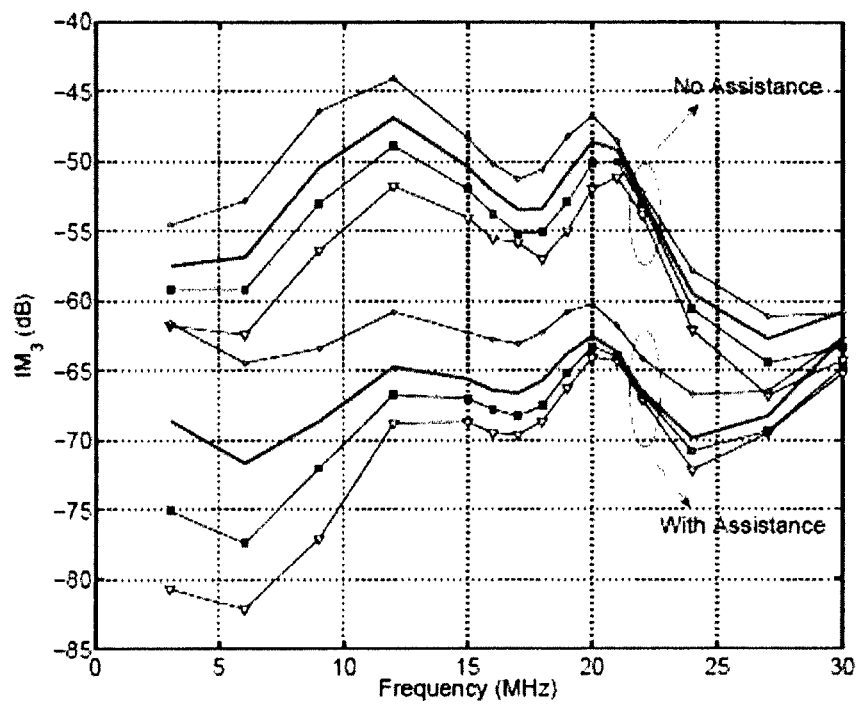
FIG. 27 illustrates measured intermodulation distortion for a chip with/without assistance, for varying OTA tail currents.

FIG. 27 illustrates measured intermodulation distortion for a chip with/without assistance, for varying OTA tail currents. The grey curves show the $IM_3$ for the nominal bias current. As the current is increased (or reduced) from the nominal value, the $IM_3$ also increases (or decreases). As $IM_3 \propto (I_{tail})^{-2.5}$, increasing $I_{tail}$ by 10% (20%) results in a decrease in $IM_3$ by about 2 dB (4 dB). This is the same for the filter without assistance as illustrated in FIG. 27. Also, for the filter without assistance, as the bias current is increased (decreased), the peak of the $IM_3$ curves shifts towards higher or (lower) frequencies.

The summary of performance of OTA-RC filter with $G_m$ assistance in accordance with the present invention and OTA-RC filter without $G_m$ assistance are tabulated in the following table.

SUMMARY OF RESULTS

| | | |
|---|---|---|
| Technology | | 0.18 μm CMOS |
| Filter type | | Fifth Order Chebyshev, 1 dB Ripple |
| Supply voltage | | 1.8 V |
| Band Edge Frequency | | 20 MHz |
| Topology of OTA filter | Without Assistance | With assistance |
| Filter core area (in mm²) | 0.20 | 0.22 |
| Filter core power (in mW) | 4.5 | 4.5 |
| Bias circuitry power (in mW) | 1.0 | 1.1 |
| Integrated output noise (in $V_{rms}$) | 1.04 | 0.98 |
| $IIIP_3$ at the band edge (in dBV) | 2.3 | 14.5 |
| (in dBm) | 15.3 | 27.5 |
| $IIIP_3$ @ 6 MHz (in dBV) | 12.2 dBV | 30.5 dBV |
| (in dBm) | 25.21 | 43.3 |
| Inband two-tone SFDR (in dB) | 48.1 | 60.3 |

It is observed that a good linearity is achieved even with a single-stage OTA. The power dissipation of both the filter cores is 4.5 mW, while the bias generation and servo circuitry consumes 1 mW (1.1 mW) in the conventional (assisted) filters.

The tabulation is based on the data corresponding to chip C illustrated in FIG. 26. The in-band two tone SFDR is the ratio of the input power to the power of the intermodulation products, when the latter is equal to noise power of the filter. The relationship between the SFDR, IIP$_3$ and RMS noise ($P_{noise}$) is given by $$SFDR_{dB} = (2/3)[IIP_{3,dBV} - P_{noise,dBV}] \quad (6)$$

The comparison of the performance of $G_m$-assisted-OTA-RC design ideated in the present invention with other state-of-the art filter designs disclosed in the prior art is given in the following table.

| Ref. No | B/W (MHz) | Order | Type | Inband IIP$_3$ (dBm) | Inband two tone SFDR (dB) | Power (mW) | Feature Size (μm) | Supply (V) | FOM (fJ) |
|---|---|---|---|---|---|---|---|---|---|
| (11) | 2.75 | 5 | Bt | 27 | 46.4 | 3.3 | 0.13 | 1.2 | 5.5 |
| (12) | 20 | 3 | Bt | 19 | 60.6 | 11.1 | 0.18 | 1.2 | 0.16 |
| (15) | 19.7 | 5 | Ch | 18.3 | 55.1 | 11.25 | 0.13 | 1.5 | 0.35 |
| (16) | 10 | 5 | Ch | 21.3 | 50.1 | 4.6 | 0.12 | 1.0 | 0.9 |
| (17) | 111 | 4 | Bs | 21 | 64.5 | 14.0 | 0.13 | 1.2 | 0.11 |
| (18) | 10 | 4 | Bs | 17.5 | 64 | 4.1 | 0.18 | 1.8 | 0.04 |
| P | 20 | 5 | Bs | 41.5 | 60.3 | 4.5 | 0.18 | 1.8 | 0.04 | wherein
"Bt" refers to Butterworth filter,
"Bs" refers to Bessel filter and
"Ch" refers to Chebyshev filter and further
(11) refers to "A Switchable-Order G$_m$-C Baseband Filter with Wide Digital Tuning for Configurable Radio Receivers",
(12) refers to "A Wide Tuning Range G$_m$-C Filter for Multi-Mode CMOS Direct-Conversion Wireless Receivers",
(15) refers to "A 19.7 MHz fifth order active-RC Chebyshev Low Pass Filter",
(16) refers to "A low-power wideband reconfigurable integrated active-RC filter with 73 dB SFDR",
(17) refers to "A fourth order active-G$_m$-RC reconfigurable (UMTS/WLAN) filter",
(18) refers to "A 4.1 mW 10 MHz fourth-order source-follower-based continuous-time filter with 79 dB DR", and
P refers to the filter design envisaged in the present invention.

Although it is difficult to compare the various filters with various topologies disclosed in the prior art with the filter design ideated in the present invention, still the distinction can be specified using Figure of Merit (FOM) which is given by $$FOM = \frac{Power}{Order.SFDR.Bandwidth} \quad (7)$$

It is seen that the linearity of the filter presented in this work is significantly higher, and a very competitive FOM is achieved with the G$_m$-assisted-OTA-RC design ideated in the present invention.

In summary, the present invention combines the advantages of active-RC and Gm–C integrators. The result, called the Gm-assisted OTA-RC integrator, is capable of higher speed/linearity operation when compared to a conventional active-RC design. A possible implementation of a Gm-assisted, single-stage folded-cascode OTA based active-RC filter is explained herein above. Measurements from a 20 MHz fifth order Chebyshev filter incorporating Gm-assistance shows a significant reduction in the third order intermodulation distortion, without adding extra noise and without extra power, thereby confirming the efficacy of the technique.

TECHNICAL ADVANCEMENTS

The system in accordance with the present invention described herein above has several technical advantages including but not limited to the realization of:
a low distortion active filter that combines a G$_m$–C and an active-RC integrator;
low distortion active filters that have enhanced linearity and speed as compared to active-RC integrators;
low distortion active filters that leverage the speed of G$_m$–C integrators; and
low distortion active filters that do not incur noise and distortion penalties of G$_m$–C integrators.

The numerical values given of various physical parameters, dimensions and quantities are only approximate values and it is envisaged that the values higher or lower than the numerical value assigned to the physical parameters, dimensions and quantities fall within the scope of the invention unless there is a statement in the specification to the contrary.

While considerable emphasis has been placed herein on the particular features of this invention, it will be appreciated that various modifications can be made, and that many changes can be made in the preferred embodiment without departing from the principles of the invention. These and other modifications in the nature of the invention or the preferred embodiments will be apparent to those skilled in the art from the disclosure herein, whereby it is to be distinctly understood that the foregoing descriptive matter is to be interpreted merely as illustrative of the invention and not as a limitation.

The invention claimed is:

1. An integrated continuous-time active-RC filter comprising a set of opamp integrators with Operational Transconductance Amplifiers (OTAs); said filter characterized by:
    at least one assistant transconductor being connected between an input and an output of each of the integrators of the set, said at least one assistant transconductor adapted to inject an assistant current into the output of each of the integrators in the set, to enhance the linearity and speed of the opamp integrators of the set;
    wherein said at least one assistant transconductor comprises:
        a plurality of sets of MOSFETS connected in parallel to each other;
        each set of MOSFETS being formed by a pair of MOSFETS connected in series, said pair of MOSFETS connected in series comprising a first MOSFET operating in the triode region and a second MOSFET operating in the saturation region.

2. The filter as claimed in claim 1, wherein the set of opamp integrators includes at least one single stage transconductor as the Operational Transconductance Amplifier (OTA).

3. The filter as claimed in claim 1, wherein the Operational Transconductance Amplifiers (OTAs) include at least one Miller compensated two stage Operational Transconductance Amplifier (OTA).

4. The filter as claimed in claim 1, wherein the Operational Transconductance Amplifiers (OTAs) include at least one two stage feed forward Operational Transconductance Amplifier (OTA).

5. The filter as claimed in claim 1, wherein the Operational Transconductance Amplifier (OTA) is implemented as a folded cascode structure.

6. The filter as claimed in claim 1, wherein the set of opamp integrators is adapted to drive resistive loads.

7. A method for limiting distortion in an integrated continuous-time active-RC filter comprising a set of opamp integrators with Operational Transconductance Amplifiers (OTAs), said method comprising the following steps:

connecting at least one assistant transconductor between an input and an output of each of the opamp integrators of the set;

injecting an assistant current into the output of each of the integrators in the set, said assistant current being equal to a current that the integrators need to source/sink; and driving a virtual ground voltage of the OTA to zero;

wherein the step of connecting at least one assistant transconductor further comprises the steps of:

connecting a pair of MOSFETS in series to form a set of MOSFETS;

operating a first MOSFET of said pair in the triode region and a second MOSFET of said pair in the saturation region; and connecting a plurality of said sets of MOSFETS in parallel to each other.

8. The filter as claimed in claim 1, wherein each of the integrators comprises a plurality of sets of MOSFETS connected in cascode configuration, each set of MOSFETS being formed by a pair of MOSFETS connected to each other by their Gates, the assistant current being injected into a Source of each MOSFET of at least one set of MOSFETS.

* * * * *